US006547843B2

(12) United States Patent
Shimazu et al.

(10) Patent No.: US 6,547,843 B2
(45) Date of Patent: Apr. 15, 2003

(54) LSI DEVICE POLISHING COMPOSITION AND METHOD FOR PRODUCING LSI DEVICE

(75) Inventors: Yoshitomo Shimazu, Nagano (JP); Takanori Kido, Nagano (JP); Nobuo Uotani, Chiba (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 09/775,611

(22) Filed: Jul. 2, 2001

(65) Prior Publication Data

US 2002/0017064 A1 Feb. 14, 2002

(30) Foreign Application Priority Data

Feb. 4, 2000 (JP) ........................................ 2000-067743

(51) Int. Cl.⁷ ........................... C09G 1/02; H01L 21/321
(52) U.S. Cl. ......................... 51/309; 51/307; 51/308; 106/3; 438/692; 438/693
(58) Field of Search ........................ 51/307, 308, 309; 106/3; 438/692, 693; 252/79.1, 79.5; 216/89, 100, 105, 106, 108

(56) References Cited

U.S. PATENT DOCUMENTS

| 5,575,885 A | | 11/1996 | Hirabayashi et al. ..... 156/626.1 |
| 6,039,891 A | * | 3/2000 | Kaufman et al. .......... 252/79.1 |
| 6,063,306 A | * | 5/2000 | Kaufman et al. ............. 216/89 |
| 6,139,763 A | * | 10/2000 | Ina et al. ..................... 134/1.3 |
| 6,309,560 B1 | * | 10/2001 | Kaufman et al. .......... 252/79.1 |

FOREIGN PATENT DOCUMENTS

| EP | 0 811 665 A2 | 5/1997 | |
| JP | 2000-306873 | 11/2000 | ......... H01L/21/304 |
| JP | 2001-31950 | 2/2001 | ............. C09K/3/14 |
| JP | 2001-35820 | 2/2001 | ......... H01L/21/304 |
| JP | 2001-68438 | 3/2001 | ......... H01L/21/304 |

OTHER PUBLICATIONS

Abstract of EP 0 811 665 A2 May 8, 1997.
Abstract of JP 2000–306873 Nov. 2, 2000.
Abstract of JP 2001–31950 Feb. 6, 2001.
Abstract of JP 2001–35820 Feb. 9, 2001.
Abstract of JP 2001–68438 Mar. 16, 2001.

* cited by examiner

Primary Examiner—Michael Marcheschi
(74) Attorney, Agent, or Firm—Sughrue Mion, PLLC

(57) ABSTRACT

The present invention provides an LSI device polishing composition containing water, abrasive grains, an organic acid, and an oxidizing agent, and having a pH of 5.5–10.0 adjusted by an alkaline substance, the LSI device polishing composition being used for polishing a copper-containing metal wiring layer in which copper is deposited on an insulating film via barrier metal formed of Ta or TaN; and a method for producing LSI devices by use of the polishing composition. During polishing of a barrier metal such as Ta or TaN and a copper wiring layer, the rate of polishing Ta or TaN can be enhanced, to thereby prevent dishing and erosion.

9 Claims, 2 Drawing Sheets

LSI DEVICE POLISHING COMPOSITION AND METHOD FOR PRODUCING LSI DEVICE

FIELD OF THE INVENTION

The present invention relates to a composition for polishing a metal layer and a barrier film during a production step of an LSI device, and more particularly, to such a polishing composition particularly suitable for polishing a multiple layer formed of a metal layer and a thin film, wherein the metal layer is formed of copper and the thin film is formed of a tantalum-containing alloy such as tantalum or tantalum nitride. The invention also relates to a method for producing an LSI device by use of the polishing composition.

BACKGROUND OF THE INVENTION

The degree of integration of LSI devices has increased year by year. One basic technique for realizing a high degree of integration is a polishing process. In a step for producing an LSI device, application of techniques for the polishing process such as buried metal polishing (i.e., the damascene method) for forming micro-wiring keeping pace with micro-scaling of a design rule is under way. However, enhancement of integration of an LSI device results in an increase in semiconductor surface roughness, generating steps that cause trouble such as breakage of wiring, an increase in resistance, or generation of electromigration. Such trouble causes problems such as a decrease in reliability. Solving the problems requires a planarization technique for compensating roughness between layers of the devices. CMP (chemical mechanical polishing) is one such technique.

Copper is an excellent wiring material, due to high electromigration resistance and low electrical resistance. Hitherto, there has been known no effective plasma etching method or method for wet-etching copper, which method can appropriately attain mechanical interconnection of copper parts. Thus, CMP of copper has been proposed as a practical technique for properly forming an interconnection part of copper parts provided on an LSI device. Accordingly, there is demand for an appropriate CMP composition for use in establishing interconnection of copper parts on an LSI device.

When copper is to be employed as wiring material, a certain barrier metal is formed in order to prevent diffusion of copper prior to the formation of copper film, since copper has a high diffusion coefficient in an interlayer insulation film. Examples of potential material for providing the barrier metal include Ta and TaN, which have excellent barrier properties. However, there arises a problem in that Ta and TaN are difficult to remove by polishing during performance of CMP. In general, when the ratio of the rate of polishing barrier metal to that of polishing copper is small, dishing, erosion, or a similar phenomenon occurs until the barrier metal is completely removed.

Upon performing CMP, copper and the barrier metal may be removed simultaneously through a single CMP step, or copper and the barrier metal may be removed respectively through two steps of CMP. In both cases, during a step for removing the barrier metal by polishing, the ratio of the rate of polishing a barrier metal formed of Ta or TaN to that of polishing copper is preferably controlled to 1.0 or more, so as to prevent occurrence of dishing or a similar phenomenon.

However, conventional polishing compositions cannot attain such a performance, and therefore, cannot be put into practice. For example, CMP slurry "EP-C4110" (product of Cabot Corp.), disclosed in proceedings of lectures of "Metal CMP *Tettei-Kensho*," held by Denshi Journal (Feb. 27, 1998) (p. 84), exhibits a ratio of the rate of polishing Ta to that of polishing Cu of 1/12.

In this connection, the following two publications disclose conventional techniques related to the present invention, though they fail to disclose the polishing rate of barrier metal.

One of the publications is Japanese Patent Application Laid-Open (kokai) No. 10-46140 authored by the present inventors, disclosing a neutral LSI device polishing composition which comprises a carboxylic acid, an oxidizing agent, and water.

The other publication is Japanese Patent Application Laid-Open (kokai) No. 8-45934, disclosing an LSI device polishing composition containing abrasive grains which have been treated with an amino-group-containing surface treatment agent.

Japanese Patent Application Laid-Open (kokai) No. 10-46140 authored by the present inventors discloses a neutral LSI device polishing composition which comprises a carboxylic acid, an oxidizing agent, and water, but discloses neither use of abrasive grains which have been treated with a coupling agent nor polishing performance in relation to barrier metal. Furthermore, the kokai publication fails to disclose the teaching that the rate of polishing copper can be reduced by adjusting the pH of a polishing composition by use of at least one alkaline substance selected from among alkali metal hydroxides such as NaOH and KOH; alkali metal carbonates such as $Na_2CO_3$ and $K_2CO_3$; alkali metal hydroxides such as $Mg(OH)_2$ and $Ca(OH)_2$; and hindered amines such as 2,2,6,6-tetramethyl-4-hydroxypiperidine, 2,2,6,6-tetramethylpiperidine, 2,2,6,6-tetramethyl-4-piperidone, 2,2,4,4,6-pentamethyl-2,3,4,5-tetrahydropyrimidine, 1,9-diaza-2,2,8,8,10,10-hexamethyl-spiro[5.5]undecan-4-one, and 6-aza-7,7-dimethylspiro[4.5]decan-9-one. Thus, the present invention cannot be easily attained solely on the basis of that kokai publication, and therefore the patentability of the present invention is not impaired.

The aforementioned Japanese Patent Application Laid-Open (kokai) No. 8-45934 discloses that a surface of the metal wiring layer formed on the semiconductor substrate is polished by use of abrasive grains which have been treated with an amino-group-containing surface treatment agent.

This technique, clearly described in ibid. (p. 2, right column, line 16–42), is employed for preventing, through enhancement of dispersibility of silicon oxide micrograms in an acidic solution, generation of damage; i.e., scratches, in surfaces of a multi-layer wiring layer and an interlayer insulating film of an LSI device. To attain this object, there have been proposed silicon oxide micrograms on which surfaces are covered with a basic layer formed through surface treatment by use of an amino-group-containing organosilicon compound. A working example of the above patent publication describes a process of polishing a tungsten wiring layer by use of silicon oxide micrograms which have been surface-treated by reaction in solution with γ-aminopropyltriethoxysilane or N-2-aminoethyl-3-aminopropyltrimethoxysilane.

This technique does not impair the patentability of the present patent application, for the reasons described hereinbelow.

(1) The technique described in that patent specification is intended to enhance dispersibility of silicon oxide micrograms in an acidic solution. For example, as described in Example 1, $K_2[Fe(CN)_6]+KH_2PO_4$ are added to a slurry, to thereby adjust the pH to 5.0, which corresponds to an acidic pH region.

In contrast, the composition of the present invention has a pH of 5.5–10.0, which corresponds to a neutral to weakly alkaline pH region. Therefore, the above effect for enhancing dispersibility of silicon oxide micrograms through surface treatment cannot be attained.

Furthermore, the composition of the present invention can control the ratio of the rate of polishing barrier metal to that of polishing copper and can reduce the rate of dissolving copper, because the pH of the composition is adjusted within a neutral to weakly alkaline pH region. Therefore, the composition of the present invention is not taught by the above patent publication which premises use of the composition in an acidic pH region.

(2) The above patent publication provides no description in relation to the rate of polishing wiring layer metal or barrier metal. Although a process of polishing a tungsten wiring layer is described in an Example, the process is evaluated in terms of only the scratch status.

In the present invention, one of the problems to be solved is controlling within a predetermined range the ratio of the rate of polishing a barrier metal formed of Ta or TaN to the rate of polishing copper, in order to suppress dishing or a similar phenomenon. Therefore, the above patent publication provides no teaching of the present invention.

(3) Although the above patent publication describes the type of the surface treatment agent and the method of surface treatment, it provides no description in relation to the amount of the surface treatment agent.

The amount of surface treatment which can be effective in the present invention is 0.001–50 mass % based on the total amount of abrasive grains, which is not taught by the above patent publication.

SUMMARY OF THE INVENTION

An object of the present invention is to provide a composition for polishing LSI devices having copper wiring, which composition exhibits a high rate of polishing Ta or TaN—potential material for barrier metal used in copper-wired LSI devices—and prevents dishing and erosion. Another object of the invention is to provide a method for producing an LSI device by use of such a polishing composition.

The present inventors have carried out extensive studies so as to solve the aforementioned problems, and have found that a polishing composition comprising water, abrasive grains, an organic acid, and an oxidizing agent and having a pH of 5.5–10.0, more preferably 5.5–9.0, adjusted by an alkaline substance exhibits excellent performance for polishing LSI devices.

In the present invention, elevation of the rate of polishing a barrier metal formed of Ta or TaN is the first requirement. By incorporating an organic acid and an oxidizing agent and adjusting the pH to 5.5–10.0, more preferably 5.5–9.0, a desired polishing rate can be attained.

In order to control the rate of polishing copper to be low, the pH of the polishing composition is preferably adjusted by use of at least one alkaline substance selected from among alkali metal hydroxides such as NaOH and KOH; alkali metal carbonates such as $Na_2CO_3$ and $K_2CO_3$; alkali metal hydroxides $Mg(OH)_2$ and $Ca(OH)_2$; and hindered amines such as 2,2,6,6-tetramethyl-4-hydroxypiperidine, 2,2,6,6-tetramethylpiperidine, 2,2,6,6-tetramethyl-4-piperidone, 2,2,4,4,6-pentamethyl-2,3,4,5-tetrahydropyrimidine, 1,9-diaza-2,2,8,8,10,10-hexamethyl-spiro[5.5]undecan-4-one, and 6-aza-7,7-dimethylspiro[4.5]decan-9-one.

The composition of the present invention, having a pH of 5.5–10.0, more preferably 5.5–9.0, which corresponds to a neutral to weakly alkaline pH region, exhibits considerably low corrosiveness and is almost free of problematic dissolution of copper. The solubility of copper can be evaluated through an immersion test carried out at room temperature, and the dissolution rate (etch rate) is calculated on the basis of weight. The polishing composition of the present invention exhibits a rate of dissolving copper of 5 nm/minute or less, preferably 3 nm/minute or less, more preferably 1 nm/minute or less, indicating that substantially no dissolution of copper occurs.

Accordingly, the present invention provides:

[1] an LSI device polishing composition for use in the preparation of a metal wiring layer, characterized by comprising water, abrasive grains, an organic acid, and an oxidizing agent, and having a pH of 5.5–10.0 adjusted by an alkaline substance;

[2] an LSI device polishing composition for use in the preparation of a metal wiring layer, characterized by comprising water, abrasive grains, an organic acid, and an oxidizing agent, and having a pH of 5.5–9.0 adjusted by an alkaline substance;

[3] an LSI device polishing composition as described in [1] or [2], wherein the composition is used for polishing a copper-containing metal wiring layer in which copper is deposited on an insulating film via barrier metal formed of Ta or TaN;

[4] an LSI device polishing composition as described in [1] or [2], the composition being used for polishing a copper-containing metal wiring layer in which copper is deposited on an insulating film via barrier metal such as Ta or TaN, wherein the ratio of the rate of polishing the barrier metal formed of Ta or TaN to that of polishing copper is 1.0 or more;

[5] an LSI device polishing composition as described in [1] or [2], the composition being used for polishing a copper-containing metal wiring layer in which copper is deposited on an insulating film via barrier metal such as Ta or TaN, wherein the ratio of the rate of polishing the barrier metal formed of Ta or TaN to that of polishing copper is 1.0 or more and the rate of dissolving copper is 5 nm/minute or less;

[6] an LSI device polishing composition as described in [1] or [2], the composition being used for polishing a copper-containing metal wiring layer in which copper is deposited on an insulating film via barrier metal such as Ta or TaN, wherein the ratio of the rate of polishing the barrier metal formed of Ta or TaN to that of polishing copper is 1.0 or more and the rate of dissolving copper is 1 nm/minute or less;

[7] an LSI device polishing composition as described in [1] or [2], wherein the alkaline substance is KOH;

[8] an LSI device polishing composition as described in [1] or [2], wherein the alkaline substance is at least one hindered amine selected from among 2,2,6,6-tetramethyl-4-hydroxypiperidine, 2,2,6,6-tetramethylpiperidine, 2,2,6,6-tetramethyl-4-piperidone, 2,2,4,4,6-pentamethyl-2,3,4,5-tetrahydropyrimidine, 1,9-diaza-2,2,8,8,10,10- hexamethyl-spiro[5.5]undecan-4-one, 6-aza-7,7-dimethylspiro[4.5]decan-9-one, and 1-aza-2,2-dimethylspiro[5.5]undecan-4-one;

[9] an LSI device polishing composition as described in [1] or [2], wherein the abrasive grains predominantly comprise at least one compound selected from among silicon oxide, aluminum oxide, cerium oxide, titanium oxide, zirconium oxide, a complex metal oxide, and a metal hydroxide;

[10] an LSI device polishing composition as described in [1] or [2], wherein the abrasive grains are formed of silicon oxide produced through a vapor phase method;

[11] an LSI device polishing composition as described in [1] or [2], wherein the abrasive grains are surface-treated with a coupling agent;

[12] an LSI device polishing composition as described in [1] or [2], wherein the abrasive grains are surface-treated with a coupling agent having at least one amino group;

[13] an LSI device polishing composition as described in [1] or [2], wherein the organic acid comprises at least one organic acid selected from among malic acid, nicotinic acid, gluconic acid, citric acid, tartaric acid, succinic acid, acetic acid, oxalic acid, adipic acid, butyric acid, capric acid, caproic acid, caprylic acid, glutaric acid, glycollic acid, formic acid, fumaric acid, maleic acid, malonic acid, phthalic acid, propionic acid, and pyruvic acid;

[14] an LSI device polishing composition as described in [1] or [2], wherein the oxidizing agent is hydrogen peroxide;

[15] a method for producing an LSI device comprising polishing, by use of a polishing composition, a copper-containing metal wiring layer in which copper is deposited on an insulating film via barrier metal formed of Ta or TaN, the composition comprising water, abrasive grains, an organic acid, and an oxidizing agent and having a pH of 5.5–10.0 adjusted by an alkaline substance;

[16] a method for producing LSI devices comprising polishing, by use of a polishing composition, a copper-containing metal wiring layer in which copper is deposited on an insulating film via barrier metal formed of Ta or TaN, the composition comprising water, abrasive grains, an organic acid, and an oxidizing agent and having a pH of 5.5–9.0 adjusted by an alkaline substance; and

[17] a method for producing LSI devices as described in [15] or [16], wherein the method comprises
providing a barrier metal layer formed of Ta or TaN on the entire surface of an insulating film including a trench portion;
depositing copper on the barrier metal layer so as to completely bury the trench portion; and,
subsequently, polishing copper formed on the barrier metal layer and the barrier metal by use of the polishing composition so as to selectively remove copper buried in the trench portion included in the insulating film, to thereby form a buried copper wiring layer.

DETAILED DESCRIPTION OF THE INVENTION

Figure 1:
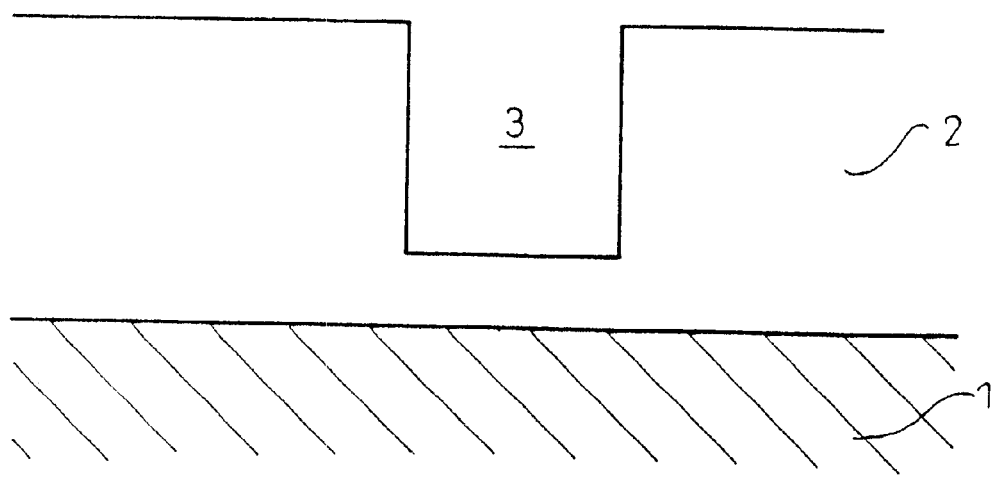
FIG. 1 shows a step for forming a copper wiring layer according to the present invention.

The present invention is directed to an LSI device polishing composition for use in the preparation of a metal wiring layer, which composition comprises water, abrasive particles, an oxidizing agent, and an organic acid and has a pH of 5.5–10.0, preferably 5.5–9.0, adjusted by use of an alkaline substance. The polishing composition of the present invention can be suitably used when the metal wiring layer is a copper-containing metal wiring layer in which copper is deposited on an insulating film via barrier metal formed of Ta or TaN. When the ratio of the rate of polishing the barrier metal formed of Ta or TaN to the rate of polishing copper is 1.0 or more, the polishing composition of the present invention can be used more suitably, because dishing and erosion are suppressed. Particularly, a ratio in terms of the polishing rate of 1.0–2.0 is preferred.

According to the present invention, the pH of the polishing composition is adjusted to fall within the range of 5.5–10.0, more preferably 5.5–9.0, further preferably 6.0–9.0, and most preferably 7.0–9.0. When the pH is less than 5.5 the rate of dissolving copper may increase, whereas when the pH is in excess of 10.0 the polishing procedure may be more hazardous and the load in relation to waste water treatment may increase.

In order to control the rate of polishing copper to be low, the pH of the composition is preferably adjusted by use of at least one alkaline substance selected from among alkaline metal hydroxides such as sodium hydroxide and potassium hydroxide; alkaline metal carbonates such as $Na_2CO_3$ and $K_2CO_3$; alkaline metal hydroxides such as $Mg(OH)_2$ and $Ca(OH)_2$; and hindered amines such as 2,2,6,6-tetramethyl-4-hydroxypiperidine, 2,2,6,6-tetramethylpiperidine, 2,2,6,6-tetramethyl-4-piperidone, 2,2,4,4,6-pentamethyl-2,3,4,5-tetrahydropyrimidine, 1,9-diaza-2,2,8,8,10,10-hexamethyl-spiro[5.5]undecan-4-one, and 6-aza-7,7-dimethylspiro[4.5]decan-9-one. Among them, KOH is preferred, because its applicability to polishing LSI devices has been proven. Hindered amines can suitably be used, because they contain no metal component that adversely affects the characteristics of the device.

The method for adjusting pH is not particularly limited, and an alkaline substance may be incorporated into the composition. Alternatively, a portion of or all the alkaline A substance to be incorporated into the composition may be added in the form of a salt of an organic acid. The alkaline substance incorporated into the composition may react with an organic acid, to thereby form a salt remaining in the composition.

The abrasive particles used in the present invention will next be described.

In the present invention, the species of the abrasive particles of the present invention is not particularly limited. However, at least one compound selected from among silicon oxide, aluminum oxide, cerium oxide, titanium oxide, zirconium oxide, a complex metal oxide, and a metal hydroxide can suitably be used.

Among these compounds, metal oxide particles produced through a vapor phase method are more suitably used, because the particles readily enhance the rate of polishing the barrier metal while preventing damage. In a typically employed vapor phase method, metal oxide particles are produced through hydrolysis reaction of a starting compound such as a chloride. When a larger amount of unreacted chlorine remains, a produced slurry is prone to have higher viscosity and may corrode copper. Both cases are disadvantageous. Thus, the residual chlorine content is preferably 0.3 mass % or less.

Among metal oxide particles produced through a vapor phase method, silicon oxide particles are more preferably used, because the particles are easily surface-treated by a coupling agent.

The secondary particle size distribution profile of the aforementioned abrasive particles can be obtained through a dynamic light scattering method. The maximum secondary particle size ($d_{max}$) is preferably 5 μm or less, more preferably 3 μm or less, further preferably 1 μm or less. When $d_{max}$ is in excess of 5 μm, the particles may readily provide undesirable micro-scratches to the polished surface.

In the aforementioned secondary particle size distribution of the abrasive particles, the average secondary particle size ($d_{50}$) is preferably 0.01–1.0 μm, more preferably 0.1–0.5 μm. When $d_{50}$ is less than 0.01 μm a high rate of polishing barrier metal may be difficult to attain, whereas when $d_{50}$ is in excess of 1 μm the particles may readily provide undesirable micro-scratches to the polished surface.

The specific surface area of the aforementioned abrasive particles is preferably 5–400 $m^2/g$, more preferably 20–350 $m^2/g$, further preferably 50–300 $m^2/g$. The specific surface area is measured through a nitrogen adsorption method (the so-called "BET method"). The reason for the range is described hereunder. When the specific surface area is less than 5 $m^2/g$ the particles may readily provide undesirable micro-scratches to the-polished surface, whereas when the specific surface area is in excess of 400 $m^2/g$ a high rate of polishing barrier metal and a low residual chlorine content may be difficult to attain.

The coupling agent preferably used for treating the abrasive particles in the present invention will next be described.

In the present invention, the rate of polishing a barrier metal formed of Ta or TaN is required to increase. In order to enhance the rate of polishing the barrier metal, the abrasive particles are preferably surface-treated with a coupling agent.

By surface-treating abrasive particles with a coupling agent, the affinity between the abrasive particles and a resin pad is enhanced, to thereby cause the particles to be held firmly by the pad. As a result, the proportion of the abrasive particles that participate in polishing increases, resulting in an enhanced rate of polishing barrier metal. When abrasive particles are treated with an amino-group-containing coupling agent, surfaces of the treated abrasive particles can be charged positively. Upon polishing Ta or TaN, $Ta_2O_5$ formed on the surface comes into contact with the abrasive particles, to thereby promote polishing. Since the $Ta_2O_5$ is negatively charged, high affinity between $Ta_2O_5$ and the positively charged abrasive particles can be attained. In other words, treatment by use of an amino-group-containing coupling agent can enhance the affinity between the abrasive particles and the barrier metal, to thereby enhance the rate of polishing the barrier metal.

Examples of the coupling agent used in the present invention include silane coupling agents, titanate coupling agents, zirconate coupling agents, aluminum coupling agents, and phosphate coupling agents. Specific examples of the silane coupling agents include vinyltrichlorosilane, 1,2-dichloroethyltrichlorosilane, 1-chloroethyltrichlorosilane, 2-chloroethyltrichlorosilane, ethyltrichlorosilane, 3,3,3-trifluoropropyltrichlorosilane, 2-cyanoethyltrichlorosilane, allyltrichlorosilane, 3-bromopropyltrichlorosilane, 3-chloropropyltrichlorosilane, n-propyltrichlorosilane, 3-cyanopropyltrichlorosilane, n-butyltrichlorosilane, isobutyltrichlorosilane, pentyltrichlorosilane, hexyltrichlorosilane, benzyltrichlorosilane, p-tolyltrichlorosilane, 6-trichlorosilyl-2-norbornene, 2-trichlorosilylnorbornene, heptyltrichlorosilane, 2-(4-cyclohexenylethyl)trichlorosilane, octyltrichlorosilane, chlorophenylethyltrichlorosilane, tetradecyltrichlorosilane, octadecyltrichlorosilane, eicosyltrichlorosilane, docosyltrichlorosilane, chloromethyltrimethoxysilane, methyltrimethoxysilane, mercaptomethyltrimethoxysilane, vinyltrimethoxysilane, ethyltrimethoxysilane, 3,3,3-trifluoropropyltrimethoxysilane, 2-cyanoethyltrimethoxysilane, 3-chloropropyltrimethoxysilane, 3-mercaptopropyltrimethoxysilane, 3-aminopropyltrimethoxysilane, 2-aminoethylaminomethyltrimethoxysilane, butyltrimethoxysilane, 3-trifluoroacetoxypropyltrimethoxysilane, 3-(aminoethylaminopropyl)trimethoxysilane, phenyltrimethoxysilane, 3-glycidoxypropyltrimethoxysilane, 3-allylaminopropyltrimethoxysilane, hexyltrimethoxysilane, 3-morpholinopropyltrimethoxysilane, 3-piperazinopropyltrimethoxysilane, 3-[2-(2-aminoethylaminoethylamino)propyl]trimethoxysilane, 2-(3,4-epoxycyclohexyl)ethyltrimethoxysilane, 3-piperidinopropyltrimethoxysilane, 3-phenylaminopropyltrimethoxysilane, 3-cyclohexylaminopropyltrimethoxysilane, O,O'-diethyl-S-(2-triethoxysilylethyl)dithiophosphate, 3-benzylaminopropyltrimethoxysilane, 3-methacryloxypropyltrimethoxysilane, methyltriethoxysilane;, vinyltriethoxysilane, ethyltriethoxysilane, 3-chloropropyltriethoxysilane, propyltriethoxysilane, 3-aminopropyltriethoxysilane, 2-(2-aminoethylthioethyl)triethoxysilane, pentyltriethoxysilane, 4-chlorophenyltriethoxysilane, phenyltriethoxysilane, benzyltriethoxysilane, 6-triethoxysilyl-2-norbornene, octyltriethoxysilane, 3-(triethoxysilylpropyl)-p-nitrobenzamide, dodecyltriethoxysilane, octadecyltriethoxysilane, allyltriethoxysilane, 3-glycidoxypropyltriethoxysilane, 3-methacryloxypropyltriethoxysilane, 3-(aminoethylaminopropyl)triethoxysilane, methyltripropoxysilane, vinyltris(2-methoxyethoxy)silane, 3-glycidoxypropylmethyldiethoxysilane, 3-methacryloxypropylmethyldimethoxysilane, 3-methacryloxypropylmethyldiethoxysilane, and 3-(aminoethylaminopropyl)methyldimethoxysilane. In general, the following silicones are not considered as silane coupling agents: silicones having a hydrolyzable group in a moiety of a silazane and a derivative of silazane such as a condensation product; silicones having a hydrolyzable group in a moiety of a chlorosilane and a derivative of chlorosilane such as a condensation product; and silicones having a hydrolyzable group in a moiety of an alkoxysilane and a derivative of alkoxysilane such as a condensation product. However, such silicones can be used in the present invention. Specific examples of the titanate coupling agent include neopentyl(diallyl)oxytri(dioctyl)pyrophosphate titanate. Specific examples of the zirconate coupling agent include cyclo(dioctyl)pyrophosphate dioctylzirconate. Specific examples of the aluminum coupling agent include acetoalkoxyaluminum diisopropirate. Specific examples of the phosphate coupling agent include dibutyl 2-methacryloyloxydiethylphosphate. Among these compounds, silane coupling agents, which are most widely used in the industry as coupling agent, are advantageous in terms of cost, wide variety of species, and high availability. Among these silane coupling agents, alkoxysilanes are preferred. Examples of the alkoxysilanes include vinyltrimethoxysilane, vinyltriethoxysilane, 2-(3,4-epoxycyclohexyl)ethyltrimethoxysilane, 3-glycidoxypropyltrimethoxysilane, 3-glycidoxypropyltriethoxysilane, 3-glycidoxypropylmethyldiethoxysilane, 3-methacryloxypropyltrimethoxysilane, 3-methacryloxypropyltriethoxysilane, 3-methacryloxypropylmethyldimethoxysilane, 3-methacryloxypropylmethyldiethoxysilane, 3-aminopropyltrimethoxysilane, 2-aminoethylaminomethyltrimethoxysilane, 3-(aminoethylaminopropyl)trimethoxysilane, 3-[2-(2-aminoethylaminoethylamino)propyl]trimethoxysilane, 3-phenylaminopropyltrimethoxysilane, 3-cyclohexylaminopropyltrimethoxysilane, 3-benzylaminopropyltrimethoxysilane, 3-aminopropyltriethoxysilane, 2-(2-aminoethylthioethyl) triethoxysilane, 3-(aminoethylaminopropyl)triethoxysilane, 3-(aminoethylaminopropyl)methyldimethoxysilane, 3-chloropropyltrimethoxysilane, 3-chloropropyltriethoxysilane, mercaptomethyltrimethoxysilane, and 3-mercaptopropyltrimethoxysilane. In addition, amino-group-containing silane coupling agents such as 3-(aminoethylaminopropyl)methyldimethoxysilane, 3-(aminoethylaminopropyl)trimethoxysilane, 3-(aminoethylaminopropyl)triethoxysilane, 3-aminopropyltrimethoxysilane, and 3-aminopropyltriethoxysilane are most advantageously used in the polishing composition of the present invention employing water as a dispersion medium, since these silanes are considerably highly stable in an aqueous solution.

The suitable amount of the coupling agent varies depending on the species of the coupling agent, the method of surface-treatment, and physical properties of the abrasive particles to be surface-treated. However, the amount of the coupling agent is preferably 0.001–50 mass %, more preferably 0.01–30 mass %, further preferably 0.1–20 mass % based on the total amount of abrasive particles. When the amount of the coupling agent is less than 0.001 mass % the affinity between the abrasive particles and a pad is disadvantageously difficult to improve, whereas when the amount of the coupling agent is in excess of 50 mass % the treated abrasive particles become water-repellent, to thereby possibly lose water-dispersibility. In addition, the coupling agent prevents the abrasive particles from coming into direct contact with the barrier metal to be processed, resulting in a decrease in polishing rate.

In the present invention, the method of surface-treatment by use of a coupling agent is not particularly limited. However, any of typical, industrially established methods may be employed. For example, there can be employed a dry method in which a coupling agent solution is sprayed, by means of dry air or nitrogen, into abrasive particles, and the coupling agent is thoroughly mixed with the abrasive particles under forced stirring by use of an apparatus such as a V-type blender, followed by heat-treatment at about 100–200° C., to thereby cause condensation reaction on the surfaces of the abrasive particles. In addition, there can be employed a wet method in which abrasive particles are dispersed in a medium such as water, and a solution of a coupling agent is added to the thus-obtained slurry, followed by solid/liquid phase separation and drying at about 100–200° C. According to the present invention, the aforementioned heat-treatment at about 100–200° C., which is performed in a surface-treatment procedure that utilizes a typical coupling agent, can be omitted. In other words, surface-treatment can be effected by a coupling agent even when a predetermined amount of a coupling agent is simply admixed with a slurry in which abrasive particles are suspended in water.

As described above, the polishing composition of the present invention containing abrasive particles that have been surface-treated with a coupling agent can be obtained by dispersing in water abrasive particles that have been surface-treated with a coupling agent, preferably in pure water. Alternatively, when a predetermined amount of a coupling agent is mixed with a polishing composition comprising a slurry in which abrasive particles are suspended in water, the abrasive particles can be surface-treated to some extent by the coupling agent. Therefore, the thus-obtained mixture may be used as the polishing composition of the present invention. The method for dispersing an inorganic compound is not particularly limited. A known dispersing apparatus such as a commonly used agitator, a homomixer, a turbine mixer, or a stirred media mill may be used. In the dispersion procedure, a known dispersant suitable for an aqueous slurry, such as a polycarboxylate salt or a condensation product of a naphthalenesulfonate salt with formalin, may be added. In addition, in order to remove large aggregated particles, separation through sedimentation or filtration may be performed.

In the present invention, the amount of the abrasive particles is preferably 0.1–20 mass %, more preferably 0.5–15 mass %, further preferably 1.0–10 mass %. When the amount of the abrasive particles is less than 0.1 mass % a high rate of polishing the barrier metal is difficult to attain, whereas when the amount is in excess of 20 mass % a polishing rate commensurate with the amount of the abrasive particles cannot be obtained, which is disadvantageous in terms of cost.

Organic acids used in the present invention will next be described.

The organic acid is incorporated into the composition in combination with an oxidizing agent, to thereby effectively enhance the rate of polishing the barrier metal.

The species of the organic acid is not particularly limited. However, carboxylic acids are preferably used, because they are readily available at low cost in the industry and are less hazardous.

Examples of the carboxylic acid include malic acid, nicotinic acid, gluconic acid, citric acid, tartaric acid, succinic acid, acetic acid, oxalic acid, adipic acid, butyric acid, capric acid, caproic acid, caprylic acid, glutaric acid, glycollic acid, formic acid, fumaric acid, maleic acid, malonic acid, phthalic acid, propionic acid, and pyruvic acid. The carboxylic acids may be used singly or in combination of two or more species.

The organic acid concentration is preferably 0.01–20 mass %, more preferably 0.1–15 mass %, further preferably 0.5–10 mass %. When the concentration is less than 0.01 mass % a high rate of polishing the barrier metal is difficult to attain, whereas when the amount is in excess of 20 mass % copper may be dissolved during polishing. Both cases are disadvantageous. A portion of or all the organic acid may remain in the form of a salt, formed through reaction with an alkaline substance.

The oxidizing agent used in the present invention will next be described.

The oxidizing agent, when used in CMP, promotes oxidization reaction of a metal, to thereby increase the polishing rate. The species of the oxidizing agent used is not particularly limited so long as it is water-soluble. Examples of such oxidizing agents include hydrogen peroxide; a permanganate such as potassium permanganate; a chromate such as sodium chromate; a nitric acid compound such as such as nitric acid; a peroxo acid compound such as peroxodisulfuric acid; an oxo acid compound such as perchloric acid; a transition metal salt such as potassium ferricyanide; and an organic oxidizing agent such as peracetic acid or nitrobenzene. Among these oxidizing agents, hydrogen peroxide is particularly preferred, because hydrogen peroxide contains no metallic component; generates a non-toxic by-product or decomposition product through reaction; and has already been used in an agent such as a cleaning liquid used in the semiconductor industry.

The oxidizing agent concentration is preferably 0.01–20 mass %, more preferably 0.1–15 mass %, further preferably 0.5–10 mass %. When the concentration is less than 0.01 mass % a high rate of polishing barrier metal is difficult to attain, whereas when the concentration is in excess of 20 mass % the copper possibly dissolves during polishing. Both cases are disadvantageous.

When hydrogen peroxide is used as the oxidizing agent in the polishing composition of the present invention, in order to prevent compositional change of hydrogen peroxide during storage of the composition, the following procedure is preferably performed. Briefly, an aqueous hydrogen peroxide solution of a predetermined concentration, and a composition to which hydrogen peroxide is to be added so as to form a predetermined polishing composition are prepared separately, and combined immediately before use in chemical mechanical polishing.

The polishing composition of the present invention may contain a variety of additives known in the art, such as a viscosity modifying agent; a pH modifying agent; a buffer; a chelating agent; a surfactant; and an organic acid and a salt thereof.

The polishing composition of the present invention is used for forming a metal wiring layer of LSI devices, and more particularly for forming a copper-containing metal wiring layer in which copper is deposited on an insulating film via barrier metal formed of Ta or TaN.

The present invention will next be described with reference to the accompanying drawings. As shown in FIGS. 1 to 4, a silicon dioxide film 2 is formed on a silicon wafer 1 through a method such as a thermal oxidization method, and a trench portion 3 which corresponds to a wiring pattern is formed in the silicon dioxide film 2. The trench portion 3 can be formed through lithography.

Figure 2:
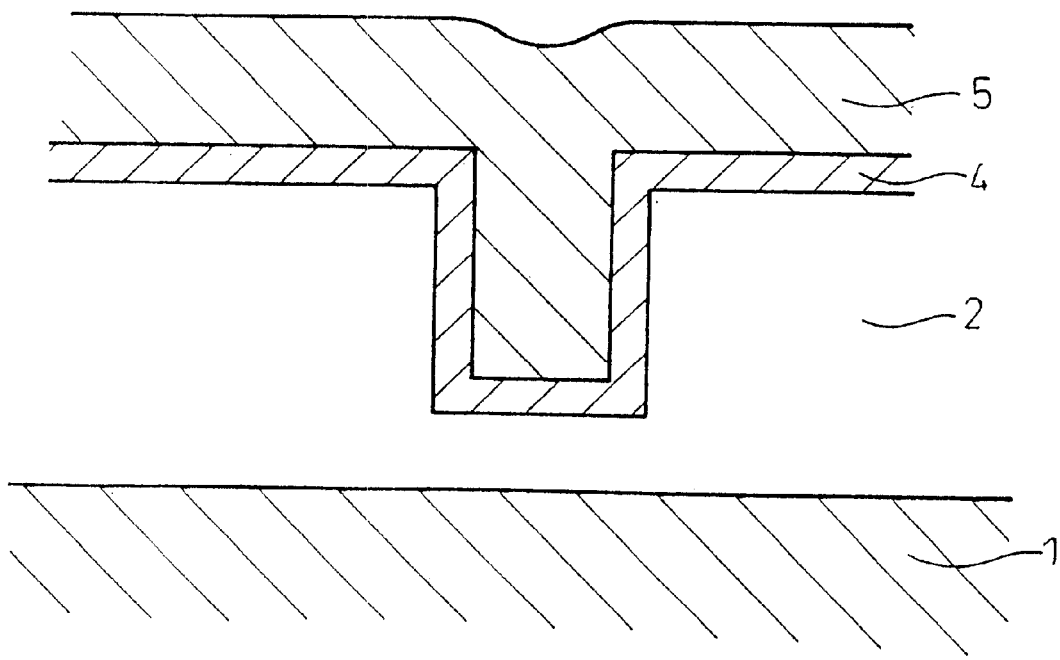
FIG. 2 shows another step for forming a copper wiring layer according to the present invention.

Subsequently, as shown in FIG. 2, a barrier metal layer 4 formed of Ta or TaN is formed on the entire surface of the silicon dioxide film 2, which includes the trench portion 3. The barrier metal is provided in order to prevent copper from diffusing into (reacting with) silicon dioxide. Therefore, the thickness of the barrier metal layer is typically about 5–200 nm. The barrier metal layer 4 can be formed through a method such as sputtering or CVD.

After formation of the barrier metal layer 4, copper is deposited on the entire surface of the barrier metal layer 4, to thereby completely fill the trench portion 3 with the copper. Through this deposition procedure, copper 5 is deposited inside the trench portion 3 as well as on the entire surface of the barrier metal layer 4 disposed on the silicon dioxide film 2. No particular limitation is imposed on the method for depositing the copper layer 5, so long as it can completely fill the trench portion 3 with copper, and methods such as sputtering, CVD, and plating may be employed.

Figure 3:
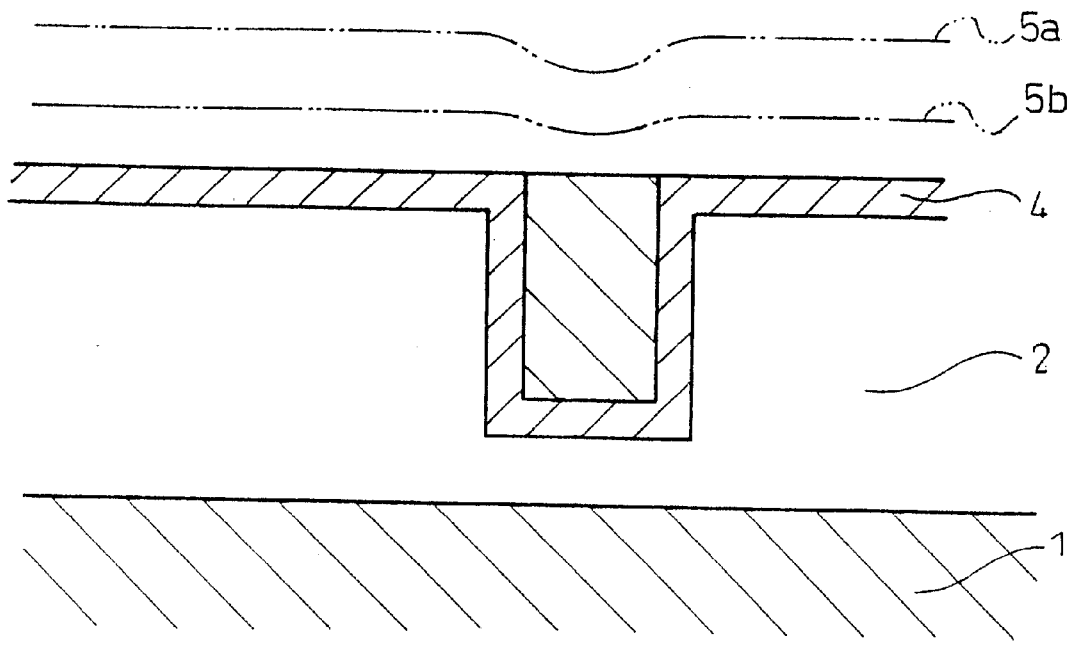
FIG. 3 shows another step for forming a copper wiring layer according to the present invention.
Figure 4:
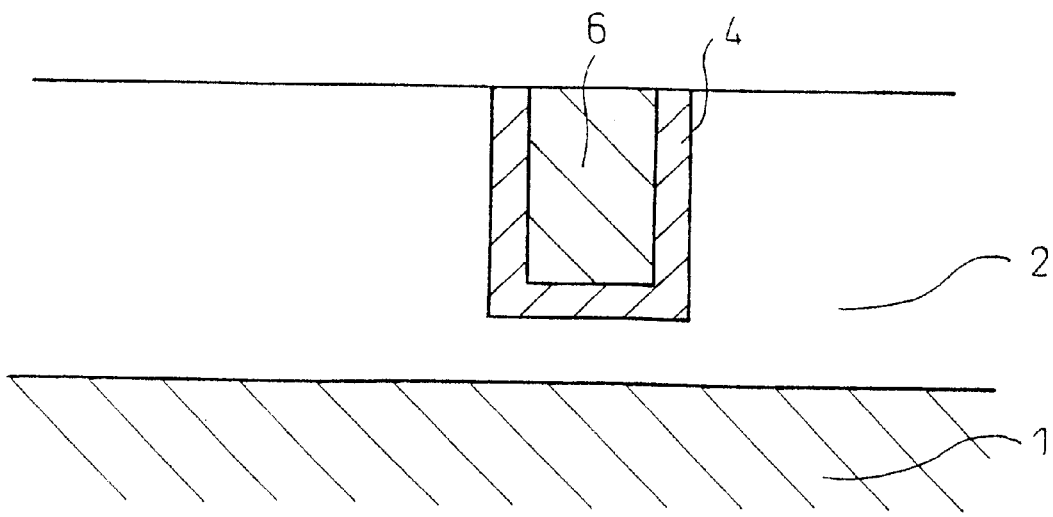
FIG. 4 shows yet another step for forming a copper wiring layer according to the present invention.

As shown in FIGS. 3 and 4, the copper layer 5 is polished by use of the polishing composition of the present invention. As shown in FIG. 3, as the polishing process proceeds, the copper layer is polished sequentially to the level of 5a, the level of 5b, and the level of the surface of the barrier metal layer 4. The surface of the silicon wafer is polished by use of a polishing pad and a polishing composition. With reference to levels 5a and 5b, the surface of the wafer is polished so as to provide an approximately flat surface. When the surface to be polished is formed exclusively of copper, a flat polished surface can be obtained. However, when the copper layer 5 and the barrier metal layer 4 are to be polished simultaneously, those two layers cannot be polished at the same polishing rate, because the surface is polished mechanically and chemically (i.e., etched). The polishing composition of the present invention can attain the same polishing rate with respect to a relatively hard barrier metal of Ta or TaN and to copper, which is relatively soft and is susceptible to corrosion through acid. Moreover, it is also desirable to prevent acid corrosion of copper serving as a wiring layer, because the corrosion may cause deterioration of the device. As described above, when the copper and the barrier metal are polished simultaneously by use of the polishing composition of the present invention, as shown in FIG. 4, the barrier metal layer 4 formed on the silicon dioxide film 2 is polished such that the level of the surface of copper 6 filled in the trench portion 3 substantially corresponds to that of the silicon dioxide film 2, to thereby yield a flat surface. In addition, corrosion due to a polishing composition can be prevented.

BEST MODES FOR CARRYING OUT THE INVENTION

The present invention will next be described in more detail by way of examples, which should not be construed as limiting the invention thereto.

EXAMPLE 1

Silicon oxide (specific surface area 230 m$^2$/g, $d_{50}$=0.12 µm, $d_{max}$=0.41 µm, residual chlorine concentration 0.1 mass %) (3 kg) produced through a vapor phase method was suspended in pure water (7 kg), and the resultant suspension was stirred for 30 minutes by means of a typical agitator, to thereby yield a slurry. To the slurry, a silane coupling agent (3-(aminoethylaminopropyl)trimethoxysilane, A-1120, product of Nippon Unicar Co., Ltd.) (300 g) was added, and the resultant mixture was further stirred for 20 hours. The formed solid was separated through filtration and heated at 120° C. for two hours, to thereby obtain silicon oxide abrasive grains that had been surface-treated with the silane coupling agent. In Example 1, the silane coupling agent was used in an amount of 10 mass % based on the total amount of silicon oxide abrasive grains.

The thus-obtained silicon oxide abrasive grains (4 mass %), malic acid (1 mass %), and hydrogen peroxide (2 mass %) were incorporated into pure water, and the pH of the mixture was adjusted by KOH to 8.5, to thereby prepare a polishing liquid.

The thus-prepared polishing composition was evaluated in terms of polishing performance to Cu and Ta.

[Polishing Conditions]

Material to be polished: Cu-film-coated wafer,
  fabricated by sequentially depositing, on a silicon wafer (diameter 15 cm), thermal oxide film (100 nm), TaN film (50 nm), and Cu film (1100 nm); and
Ta-film-coated wafer,
  fabricated by sequentially depositing, on a silicon wafer (diameter 15 cm), thermal oxide film (100 nm) and Ta film (500 nm).
Polishing pad: IC1000/SUBA400 (product of Roder-Nitta)
Polishing machine: Single side polishing machine for LSI device polishing (type SH-24, product of Speed-fam)
Rotating speed of lapping plate: 70 rpm
Processing pressure: 300 gf/cm$^2$
Slurry feed speed: 100 ml/min
Polishing time: 60 sec

[Items and Method of Evaluation]

Polishing rate: Sheet resistance measurement apparatus
  (Cu film, Ta film: calculated by deriving film thickness from sheet resistance and dividing the amount of removed film by polishing time)
Cu dissolution rate: a small sample of the Cu film-coated wafer was immersed for one hour in a slurry (temperature: 20° C.) employed in the polishing test. The weight of the sample was measured before and after immersion. The dissolution rate was calculated from surface area, specific gravity, and immersion time based on the following formula:

Dissolution rate=(weight before immersion−weight after immersion)/(specific gravity×sample surface area×immersion time).

Scratches: Observation under an optical microscope
  (The surface of the wafer was observed at a magnification of 100).

The above-described polishing test was performed, and the results are shown in Table 1.

EXAMPLE 2

The procedure of Example 1 was repeated, except that silicon oxide abrasive grains were used in an amount of 2 mass % instead of 4 mass %, to thereby produce a slurry. The same test as described in Example 1 was performed so as to evaluate polishing performance. The results are shown in Table 1.

EXAMPLE 3

The procedure of Example 2 was repeated, except that the surface treatment agent was used in an amount of 15 mass % based on the total amount of abrasive grains, to thereby produce a slurry. The same test as described in Example 1 was performed so as to evaluate polishing performance. The results are shown in Table 1.

EXAMPLE 4

The procedure of Example 2 was repeated, except that the pH was adjusted to 7.0 instead of 8.5, to thereby produce a slurry. The same test as described in Example 1 was performed so as to evaluate polishing performance. The results are shown in Table 1.

EXAMPLE 5

The procedure of Example 2 was repeated, except that the pH was adjusted to 6.0 instead of 8.5, to thereby produce a slurry. The same test as described in Example 1 was performed so as to evaluate polishing performance. The results are shown in Table 1.

EXAMPLE 6

The procedure of Example 2 was repeated, except that tartaric acid was used instead of malic acid, to thereby produce a slurry. The same test as described in Example 1 was performed so as to evaluate polishing performance. The results are shown in Table 1.

EXAMPLE 7

The procedure of Example 2 was repeated, except that adipic acid was used instead of malic acid, to thereby produce a slurry. The same test as described in Example 1 was performed so as to evaluate polishing performance. The results are shown in Table 1.

EXAMPLE 8

The procedure of Example 2 was repeated, except that malic acid was used in an amount of 10 mass % instead of 1 mass %, to thereby produce a slurry. The same test as described in Example 1 was performed so as to evaluate polishing performance. The results are shown in Table 1.

EXAMPLE 9

The procedure of Example 2 was repeated, except that 2,2,6,6-tetramethyl-4-hydroxypiperidine was used, for adjusting pH, instead of KOH, to thereby produce a slurry. The same test as described in Example 1 was performed so as to evaluate polishing performance. The results are shown in Table 1.

EXAMPLE 10

The procedure of Example 1 was repeated, except that silicon oxide having a specific surface area of 160 m$^2$/g was used instead of silicon oxide having a specific surface area of 230 m$^2$/g, to thereby produce a slurry. The same test as described in Example 1 was performed so as to evaluate polishing performance. The results are shown in Table 1.

EXAMPLE 11

The procedure of Example 2 was repeated, except that titanium oxide (specific surface area of 200 m$^2$/g, $d_{50}$=0.12 μm, $d_{max}$=0.43 μm, residual chlorine concentration of 0.2 mass %) was used instead of silicon oxide, to thereby produce a slurry. The same test as described in Example 2 was performed so as to evaluate polishing performance. The results are shown in Table 1.

EXAMPLE 12

The procedure of Example 2 was repeated, except that aluminum oxide (specific surface area of 200 m$^2$/g, $d_{50}$=0.13 μm, $d_{max}$=0.45 μm, residual chlorine concentration of 0.1 mass %) was used instead of silicon oxide, to thereby produce a slurry. The same test as described in Example 1 was performed so as to evaluate polishing performance. The results are shown in Table 1.

EXAMPLE 13

The procedure of Example 2 was repeated, except that oxalic acid was used instead of malic acid, to thereby produce a slurry. The same test as described in Example 1 was performed so as to evaluate polishing performance. The results are shown in Table 1.

EXAMPLE 14

The procedure of Example 1 was repeated, except that no surface treatment of abrasive grains was performed; to thereby produce a slurry. The same test as described in Example 1 was performed so as to evaluate polishing performance. The results are shown in Table 1.

EXAMPLE 15

The procedure of Example 2 was repeated, except that the pH was adjusted to 9.5 instead of 8.5, to thereby produce a slurry. The same test as described in Example 1 was performed so as to evaluate polishing performance. The results are shown in Table 1.

Comparative Example 1

The procedure of Example 2 was repeated, except that the pH was adjusted to 5.0 instead of 8.5, to thereby produce a slurry. The same test as described in Example 1 was performed so as to evaluate polishing performance. The results are shown in Table 1. As is clear from the results, the Cu dissolution rate increases.

Comparative Example 2

The procedure of Example 2 was repeated, except that the pH was adjusted by aqueous ammonia instead of KOH, to thereby produce a slurry. The same test as described in Example 1 was performed so as to evaluate polishing performance. The results are shown in Table 1. As is clear from the results, the Cu dissolution rate increases.

Comparative Example 3

The procedure of Example 2 was repeated, except that silicon oxide having a residual chlorine concentration of 0.5 mass % and tartaric acid were used instead of silicon oxide having a residual chlorine concentration of 0.1 mass % and malic acid, to thereby produce a slurry. The same test as described in Example 1 was performed so as to evaluate polishing performance. The results are shown in Table 1.

Comparative Example 4

The procedure of Example 13 was repeated, except that no organic acid was used, to thereby produce a slurry. The same test as described in Example 1 was performed so as to evaluate polishing performance. The results are shown in Table 1.

TABLE 1-1

| Ex. No. Comp. Ex. No. | Abrasive grains | | | | Organic acid | | pH |
|---|---|---|---|---|---|---|---|
| | Species | Concentration (mass %) | Specific surface area (m²/g) | Surface treatment (mass %)*1 | Species | mass % | |
| Ex. 1 | Si oxide | 4 | 230 | 10 | Malic | 1.0 | 8.5 |
| Ex. 2 | " | 2 | 230 | 10 | " | " | 8.5 |
| Ex. 3 | " | 2 | 230 | 15 | " | " | 8.5 |
| Ex. 4 | " | 2 | 230 | 10 | " | " | 7.0 |
| Ex. 5 | " | 2 | 230 | 10 | " | " | 6.0 |
| Ex. 6 | " | 2 | 230 | 10 | Tartaric | " | 8.5 |
| Ex. 7 | " | 2 | 230 | 10 | Adipic | " | 8.5 |
| Ex. 8 | " | 2 | 230 | 10 | Malic | 10.0 | 8.5 |
| Ex. 9 | " | 2 | 230 | 10 | " | 1.0 | 8.5*2 |
| Ex. 10 | " | 4 | 160 | 10 | " | 1.0 | 8.5 |
| Ex. 11 | Ti oxide | 2 | 200 | 10 | " | 1.0 | 8.5 |
| Ex. 12 | Al oxide | 2 | 200 | 10 | " | 1.0 | 8.5 |
| Ex. 13 | Si oxide | 2 | 230 | 10 | Oxalic | 1.0 | 8.5 |
| Ex. 14 | " | 4 | 230 | no | Malic | 1.0 | 8.5 |
| Ex. 15 | " | 2 | 230 | 10 | " | 1.0 | 9.5 |
| Comp. Ex. 1 | Si oxide | 2 | 230 | 10 | Malic | 1.0 | 5.0 |
| Comp. Ex. 2 | " | 2 | 230 | 10 | " | 1.0 | 8.5*3 |
| Comp. Ex. 3 | " | 2*4 | 230 | 10 | Tartaric | 1.0 | 8.5 |
| Comp. Ex. 4 | " | 2 | 230 | 10 | no | — | 8.5 |

(*1 The amount of employed surface treatment agent based on the total amount of abrasive grains; *2 pH adjusted with hindered amine; *3 pH adjusted with aqueous ammonia; *4 Residual chlorine concentration of 0.5 mass %

TABLE 1-2

| Ex. No. Comp. Ex. No. | Polishing rate (nm/min) | | Selection ratio | Cu Dissolution rate (nm/min) | Scratches |
|---|---|---|---|---|---|
| | Ta | Cu | Ta/Cu | | |
| Ex. 1 | 87 | 48 | 1.8 | 0 | no |
| Ex. 2 | 47 | 35 | 1.3 | 0 | no |
| Ex. 3 | 57 | 42 | 1.4 | 0 | no |
| Ex. 4 | 52 | 44 | 1.2 | 0.2 | no |
| Ex. 5 | 53 | 48 | 1.1 | 0.4 | no |
| Ex. 6 | 63 | 34 | 1.9 | 0.8 | no |
| Ex. 7 | 52 | 32 | 1.6 | 0 | no |
| Ex. 8 | 69 | 38 | 1.8 | 0.2 | no |
| Ex. 9 | 45 | 32 | 1.4 | 0.2 | no |
| Ex. 10 | 96 | 39 | 2.5 | 0 | no |
| Ex. 11 | 51 | 45 | 1.1 | 0.5 | no |
| Ex. 12 | 62 | 60 | 1.0 | 0.2 | no |
| Ex. 13 | 55 | 49 | 1.1 | 0.2 | no |

TABLE 1-2-continued

| Ex. No. Comp. Ex. No. | Polishing rate (nm/min) Ta | Polishing rate (nm/min) Cu | Selection ratio Ta/Cu | Cu Dissolution rate (nm/min) | Scratches |
|---|---|---|---|---|---|
| Ex. 14 | 71 | 40 | 1.8 | 0 | no |
| Ex. 15 | 41 | 36 | 1.1 | 0 | no |
| Comp. Ex. 1 | 50 | 297 | 0.2 | 7.4 | no |
| Comp. Ex. 2 | 47 | 132 | 0.4 | 3.1 | no |
| Comp. Ex. 3 | 65 | 62 | 1.0 | 2.0 | no |
| Comp. Ex. 4 | 13 | 21 | 0.6 | 1.6 | no |

Although in the aforementioned Examples polishing performance to Ta was evaluated, the rate of polishing TaN is generally known to be comparable to that of polishing Ta.

INDUSTRIAL APPLICABILITY

According to the present invention, a high rate of polishing a barrier metal such as Ta or TaN and a well-balanced rate of polishing copper can be attained, to thereby suppress dishing, erosion of copper, and similar drawbacks. Thus, the present invention is useful in a process for polishing LSI devices, particularly for a damascene method.

What is claimed is:

1. An LSI device polishing composition for use in the preparation of a metal wiring layer, comprising water, abrasive grains, an organic acid, and an oxidizing agent, and having a pH of 5.5–10.0 adjusted by an alkaline substance, wherein the abrasive grains are surface-treated with a coupling agent.

2. An LSI device polishing composition for use in the preparation of a metal wiring layer, comprising water, abrasive grains, an organic acid, and an oxidizing agent, and having a pH of 5.5–9.0 adjusted by an alkaline substance, wherein the abrasive grains are surface-treated with a coupling agent.

3. An LSI device polishing composition as described in claim 1 or 2, wherein the alkaline substance is KOH.

4. An LSI device polishing composition as described in claim 1 or 2, wherein the alkaline substance is at least one hindered amine selected from the group consisting of 2,2,6,6-tetramethyl-4-hydroxypiperidine, 2,2,6,6-tetramethylpiperidine, 2,2,6,6-tetramethyl-4-piperidone, 2,2,4,4,6-pentamethyl-2,3,4,5-tetrahydropyrimidine, 1,9-diaza-2,2,8,8,10,10-hexamethyl-spiro[5.5]undecan-4-one, 6-aza-7,7-dimethylspiro[4.5]decan-9-one, and 1-aza-2,2-dimethylspiro[5.5]undecan-4-one.

5. An LSI device polishing composition as described in claim 1 or 2, wherein the abrasive grains comprise at least one compound selected from the group consisting of silicon oxide, aluminum oxide, cerium oxide, titanium oxide, zirconium oxide, a complex metal oxide, and a metal hydroxide.

6. An LSI device polishing composition as described in claim 1 or 2, wherein the abrasive grains are formed of silicon oxide produced through a vapor phase method.

7. An LSI device polishing composition as described in claim 1 or 2, wherein the abrasive grains are surface-treated with a coupling agent having at least one amino group.

8. An LSI device polishing composition as described in claim 1 or 2, wherein the organic acid comprises at least one organic acid selected from the group consisting of malic acid, nicotinic acid, gluconic acid, citric acid, tartaric acid, succinic acid, acetic acid, oxalic acid, adipic acid, butyric acid, capric acid, caproic acid, caprylic acid, glutaric acid, glycollic acid, formic acid, fumaric acid, maleic acid, malonic acid, phthalic acid, propionic acid, and pyruvic acid.

9. An LSI device polishing composition as described in claim 1 or 2, wherein the oxidizing agent is hydrogen peroxide.

* * * * *

UNITED STATES PATENT AND TRADEMARK OFFICE
CERTIFICATE OF CORRECTION

PATENT NO. : 6,547,843 B2
DATED : April 15, 2003
INVENTOR(S) : Yoshitomo Shimazu, Takanori Kido and Nobuo Uotani Page 1 of 1

It is certified that error appears in the above-identified patent and that said Letters Patent is hereby corrected as shown below:

<u>Title page,</u>
Item [22], PCT Filed, "Jul. 2, 2001" should be changed to -- Feb. 5, 2001 --

Signed and Sealed this

Twenty-fifth Day of January, 2005

JON W. DUDAS
*Director of the United States Patent and Trademark Office*